United States Patent
Mazzola et al.

(10) Patent No.: US 7,294,860 B2
(45) Date of Patent: Nov. 13, 2007

(54) MONOLITHIC VERTICAL JUNCTION FIELD EFFECT TRANSISTOR AND SCHOTTKY BARRIER DIODE FABRICATED FROM SILICON CARBIDE AND METHOD FOR FABRICATING THE SAME

(75) Inventors: Michael S. Mazzola, Starkville, MS (US); Joseph N. Merrett, Starkville, MS (US)

(73) Assignees: Mississippi State University, Mississippi State, MS (US); SemiSouth Laboratories, Inc., Starkville, MS (US)

( * ) Notice: Subject to any disclaimer, the term of this patent is extended or adjusted under 35 U.S.C. 154(b) by 68 days.

(21) Appl. No.: 11/176,625

(22) Filed: Jul. 8, 2005

(65) Prior Publication Data

US 2006/0011924 A1 Jan. 19, 2006

Related U.S. Application Data

(60) Provisional application No. 60/585,881, filed on Jul. 8, 2004.

(51) Int. Cl.
- *H01L 31/0312* (2006.01)
- *H01L 27/095* (2006.01)
- *H01L 29/47* (2006.01)
- *H01L 29/812* (2006.01)
- *H01L 31/07* (2006.01)

(52) U.S. Cl. .......................................... 257/77; 257/471
(58) Field of Classification Search ................. 257/77, 257/335–349, 471–479
See application file for complete search history.

(56) References Cited

U.S. PATENT DOCUMENTS

| | | | |
|---|---|---|---|
| 4,967,243 A | 10/1990 | Baliga et al. | |
| 4,969,027 A | 11/1990 | Baliga et al. | |
| 5,111,253 A | 5/1992 | Korman | |
| 5,264,713 A | 11/1993 | Palmour | |
| 5,506,421 A | 4/1996 | Palmour | |
| 5,550,397 A | 8/1996 | Lifshitz et al. | |
| 6,097,046 A | 8/2000 | Plumton | |
| 6,624,082 B2 | 9/2003 | Luo et al. | |
| 6,693,308 B2 | 2/2004 | Sankin et al. | |
| 6,767,783 B2 | 7/2004 | Casady et al. | |
| 6,841,812 B2 | 1/2005 | Zhao | |
| 7,078,781 B2 * | 7/2006 | Hatakeyama et al. | 257/472 |
| 2002/0047124 A1 | 4/2002 | Kitabatake | |
| 2003/0042538 A1 | 3/2003 | Kumar et al. | |
| 2007/0015308 A1 * | 1/2007 | Shenoy et al. | 257/77 |

OTHER PUBLICATIONS

Sankin et al., International Conference on SiC and Related Materials 2003, Lyon, France Oct. 6-10, 2003 A Review of SiC Power Switch: Achievements, Difficulties and Perspectives.

(Continued)

*Primary Examiner*—Cuong Nguyen
(74) *Attorney, Agent, or Firm*—Merchant & Gould, P.C.; Christopher W. Raimund

(57) ABSTRACT

A switching element combining a self-aligned, vertical junction field effect transistor with etched-implanted gate and an integrated antiparallel Schottky barrier diode is described. The anode of the diode is connected to the source of the transistor at the device level in order to reduce losses due to stray inductances. The SiC surface in the SBD anode region is conditioned through dry etching to achieve a low Schottky barrier height so as to reduce power losses associated with the turn on voltage of the SBD.

14 Claims, 11 Drawing Sheets

OTHER PUBLICATIONS

Asano et al., Proceedings of the 2001 International Symposium on Power Semiconductor Devices and Ics, Osaka Japan, pp. 23-26 5.5kV Normally-off Low RonS 4H-SiC SEJFET.

Zhao et al., Solid-State Electronics 47 (2003), pp. 377-384 "Design of a Novel Planar Normally-off Power VJFETin 4H-SiC".

* cited by examiner

MONOLITHIC VERTICAL JUNCTION FIELD EFFECT TRANSISTOR AND SCHOTTKY BARRIER DIODE FABRICATED FROM SILICON CARBIDE AND METHOD FOR FABRICATING THE SAME This application claims the benefit of U.S. Provisional Patent Application Ser. No. 60/585,881, filed Jul. 8, 2004. The entirety of that provisional application is incorporated herein by reference.

This invention was made with Government support under F33615-01-D-2103 awarded by the U.S. Air Force. The Government may have certain rights in the invention.

BACKGROUND

1. Technical Field

The present application relates generally to the field of power field effect transistors and, in particular, to the field of silicon carbide junction field effect transistors for power switching applications.

2. Background of the Technology

Silicon carbide junction field effect transistors (JFETs) are well suited for high voltage and high power switching applications such as DC-to-DC converters. Vertical SiC JFETs are an attractive alternative to SiC MOSFETs at this time due to low inversion channel layer mobility and poor high temperature, high field reliability [1]. MOSFETs also have an inherent built in body diode that adds parasitic capacitance, which in turn leads to increased switching losses. However, this built in anti-parallel, p-n diode is useful in circuits where an antiparallel freewheeling diode is required. Having the diode built in to the switch eliminates stray inductances caused from the bonding required to connect the source of the switch to the anode of a discrete diode [2]. The downside, again, is that this diode is a p-n diode that has a large amount of stored charge that has to be removed when the diode goes from forward to reverse bias. Removing this stored charge adds to the total switching time and reduces the operating frequency of the circuit. Schottky diodes do not have the stored charge problem and can be switched much faster than p-n diodes.

Others have proposed integrating an SBD (Schottky barrier diode) with MOSFETs [2, 3] and bipolar Junction transistors [4]. FETs with lateral gates incorporating an SBD on a shared drift region have also been proposed [5] while others have proposed incorporating an SBD with a vertical JFET having buried parallel gates fabricated on III-V semiconductors [6].

There still exists a need, however, for a switching device that has the benefits of a MOSFETs body diode without the losses associated with switching a built-in p-n diode.

SUMMARY

According to a first embodiment, a SiC semiconductor device comprising a vertical junction field effect transistor (JFET) and a Schottky barrier diode (SBD) is provided. The device comprises a SiC semiconductor substrate layer of a first conductivity type, a SiC drift layer of the first conductivity type disposed on the substrate layer, a plurality of SiC source regions of the first conductivity type disposed on the drift layer, and a plurality of SiC gate regions of a second conductivity type different than the first conductivity type formed in the drift layer. The material of the first conductivity type can be an n-type semiconductor material and the material of the second conductivity type can be a p-type semiconductor material. The gate regions can be formed by ion implantation of a dopant of the second conductivity type in the drift layer. The device further comprises ohmic contacts adjacent the substrate layer opposite the drift layer and adjacent the source and gate regions to form the JFET. The device also comprises a Schottky junction including a Schottky metal layer adjacent the drift layer. The Schottky metal layer extends over the source ohmic contact(s) of the JFET such that the Schottky metal is in electrical contact with the source ohmic contact(s) of the device. According to this embodiment, the drain of the JFET also functions as the cathode of the SBD and the source of the JFET also functions as the anode of the SBD.

The device can further comprise final metal layers disposed on the Schottky metal layer and on the drain and gate ohmic contacts. In addition, the drift layer of the device may comprise a drift region of the first conductivity type disposed on the substrate and a channel region also of the first conductivity type disposed on the drift region wherein the source regions are disposed on the channel region. The channel region can have a higher doping level than the underlying drift region.

According to a second embodiment, a method of making a SiC semiconductor device comprising a vertical junction field effect transistor (JFET) and a Schottky barrier diode (SBD) is provided. The method according to this embodiment comprises:

positioning a first mask on a source layer of SiC of a first conductivity type, wherein the source layer is adjacent a SiC drift layer of the first conductivity type and wherein the drift layer is adjacent a SiC substrate layer of the first conductivity type;

selectively etching through the source layer and into the drift layer to form raised source regions separated by etched regions;

implanting dopants of the second conductivity type into exposed portions of the drift layer such that the implanted regions are SiC of the second conductivity type;

removing the first mask;

annealing the device to activate the dopants;

positioning a second mask on the source layer of the device;

forming gate regions, a Schottky anode region, and, optionally, edge termination structures by selectively etching through the implanted layer of the device to expose material of the first conductivity type;

removing the second mask;

depositing dielectric material on exposed etched surfaces of the device;

etching the dielectric material to expose the source regions;

selectively etching through the dielectric material over the gate region to expose implanted material;

depositing metal on exposed source and gate regions to form source and gate ohmic contacts respectively;

depositing metal on the substrate opposite the drift layer to form a drain ohmic contact;

selectively etching through the dielectric over the Schottky anode region to expose material of the first conductivity type;

depositing a Schottky metal layer in the Schottky anode region and in contact with the source ohmic contact;

depositing metal layers on the Schottky metal layer and the gate ohmic contact to form electrical contact pads;

forming a metal layer on the substrate opposite the drift layer to form the drain ohmic contact; and forming a metal layer on the drain ohmic contact to form a drain electrical contact pad;

wherein the device comprises a JFET including a source, a gate and a drain and an SBD including a cathode and an anode, wherein the drain of the JFET also functions as the cathode of the SBD and wherein the source of the JFET also functions as the anode of the SBD.

The material of the first conductivity type can be an n-type semiconductor material and the material of the second conductivity type can be a p-type semiconductor material. According to a further embodiment, the source layer is more heavily doped than the underlying drift layer. In addition, the drift layer may comprise a drift region of the first conductivity type disposed on the substrate and a channel region also of the first conductivity type disposed on the drift region wherein the source regions are disposed on the channel region. The channel region can have a higher doping level than the underlying drift region.

The method as set forth above may further comprise additional etching in the anode region to remove implanted material remaining therein. In this manner, a device having a suitably low Schottky barrier height can be formed.

According to a third embodiment, a method of making a SiC semiconductor device comprising a vertical junction field effect transistor (JFET) and a Schottky barrier diode (SBD) is provided which comprises:

positioning a first mask on a source layer of SiC of a first conductivity type, wherein the source layer is adjacent a SiC drift layer of the first conductivity type and wherein the drift layer is adjacent a SiC substrate layer of the first conductivity type;

selectively etching through the source layer and into the drift layer to form raised source regions separated by etched regions;

positioning a second mask on an exposed portion of the drift;

implanting dopants of the second conductivity type into exposed portions of the drift layer such that the implanted regions are SiC of the second conductivity type, wherein the portion of the drift layer masked by the second mask forms a Schottky anode region;

removing the first and second masks;

annealing the device to activate the dopants;

positioning a third mask on the source layer and portions of the implanted drift layer of the device;

forming gate regions and, optionally, edge termination structures by selectively etching through the implanted layer of the device to expose material of the first conductivity type;

removing the third mask;

depositing dielectric material on exposed etched surfaces of the device;

etching the dielectric material to expose the source regions;

selectively etching through the dielectric material over the gate region to expose implanted material;

depositing metal on exposed source and gate regions to form source and gate ohmic contacts respectively;

depositing metal on the substrate opposite the drift layer to form a drain ohmic contact;

selectively etching through the dielectric material over the SBD anode region to expose material of the first conductivity type;

depositing a Schottky metal layer in the Schottky anode region and in contact with the source ohmic contact;

depositing metal layers on the Schottky metal layer and the gate ohmic contact to form electrical contact pads;

forming a metal layer on the substrate opposite the drift layer to form the drain ohmic contact; and forming a metal layer on the drain ohmic contact to form a drain electrical contact pad;

wherein the device comprises a JFET including a source, a gate and a drain and an SBD including a cathode and an anode and wherein the drain of the JFET also functions as the cathode of the SBD and wherein the source of the JFET also functions as the anode of the SBD.

DETAILED DESCRIPTION

The present invention combines a trench VJFET with an integrated Schottky barrier diode (SBD) sharing a common drift region. As set forth above, incorporating a Schottky barrier diode (SBD) monolithically with a power junction field effect transistor creates a switch that has the benefits of a MOSFET's body diode without the associated losses associated with switching a built in p-n diode. In addition to faster reverse recovery times, SBD's typically have a much lower turn on voltage than p-n diodes. For example, a typical $V_{on}$ for a titanium SBD is around 0.8 V whereas a typical $V_{on}$ for a SiC p-n diode is around 2.8 Volts. For moderate current densities, this translates to much lower power losses for an SBD over a p-n.

Many designs for SiC JFETs have been proposed [7-10]. The device described herein comprises a self-aligned, vertical JFET whose basic structure is the same as the implanted gate junction FET described in U.S. patent application Ser. No. 10/193,108 (hereinafter referred to as "the '108 application"), published as U.S. Patent Application Publication 2003/0034495 A1, which application is incorporated by reference herein in its entirety. This implanted gate VJFET is combined with an SBD whose anode is formed on a common drift layer with the JFET. The anode of the SBD and the source of the JFET are connected electrically by a metallic pad. The drain contact of the JFET also doubles as the cathode for the SBD. Another contact pad forms the gate terminal for the JFET on an ohmic contact formed on the implanted p-type layer at the base of the source fingers. The source/anode contact pad is isolated from the gate region by a dielectric layer.

Figure 1A:
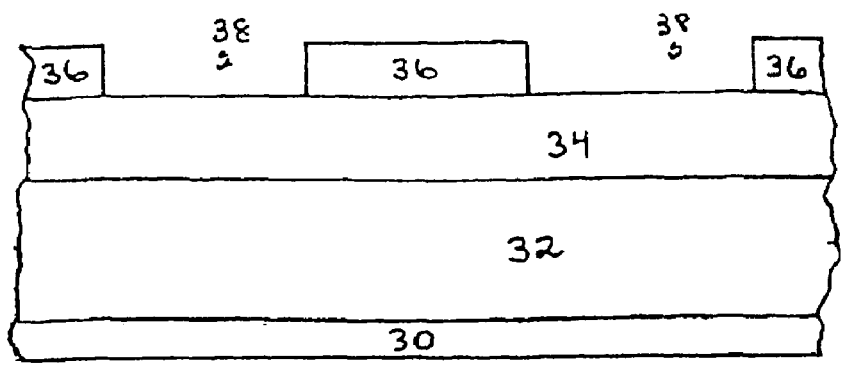
FIGS. 1A-1D illustrate a method of making a JFET according to one embodiment of the invention.
Figure 1B:
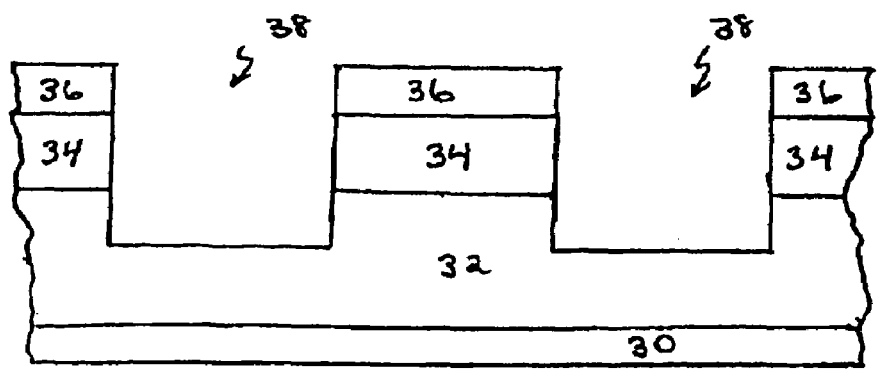
Figure 1C:
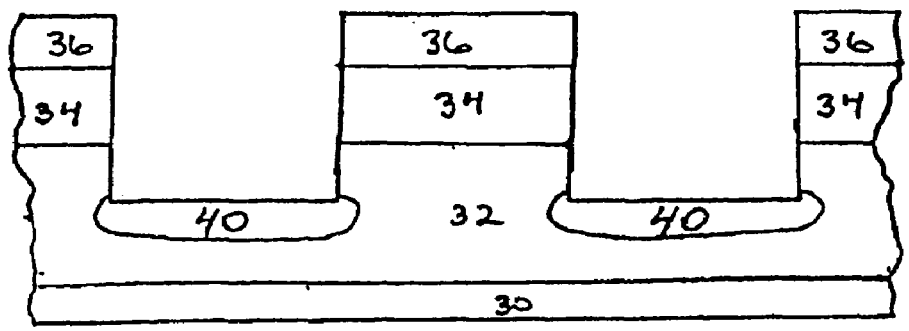

The techniques disclosed in the '108 application can be used to manufacture the JFET portion of the device. An exemplary method of manufacturing the JFET is illustrated in FIGS. 1A-1D. As shown in FIG. 1A, a SiC substrate layer 30 having a drift layer 32 and a source layer 34 of the same conductivity type disposed thereon is provided. A mask 36 is shown disposed on source layer 34. As shown in FIG. 1B, source features (e.g., fingers) are then selectively etched through source layer 34 and into drift layer 32 through openings 38 in mask 36. As shown in FIG. 1C, the same etch mask 36 can then be used as an implant mask to selectively form gate regions 40 using an ion implantation process.

Figure 1D:
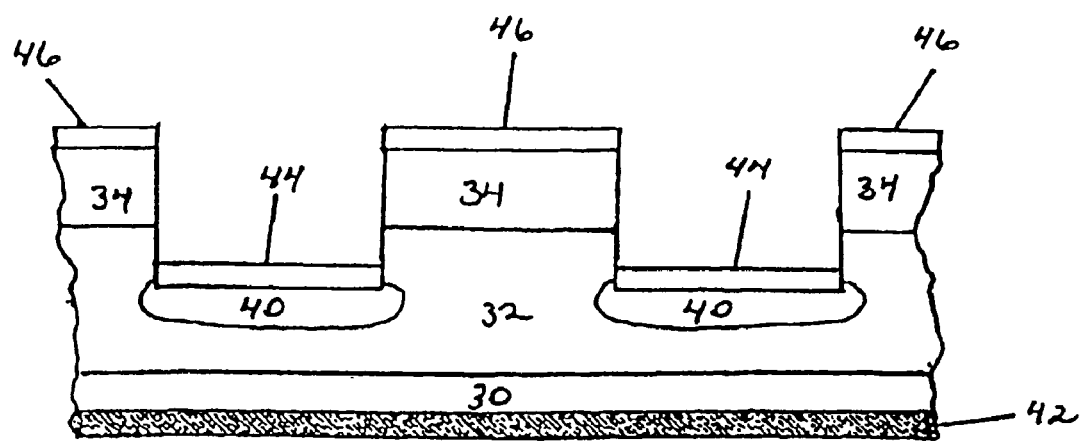

After formation of implanted gate regions 40, mask 36 can be removed and drain contact 42 can be disposed on substrate layer 30. This step is shown in FIG. 1D. Additionally, as also shown in FIG. 1D, gate ohmic contacts 44 can be disposed on implanted gate regions 40 and source ohmic contacts 46 can be disposed on unetched portions of source layer 34 to form the device.

As set forth in more detail below, certain of the above described steps used in the manufacture of the JFET portion of the device can also be used in the manufacture of the SBD portion of the device.

Figure 2:
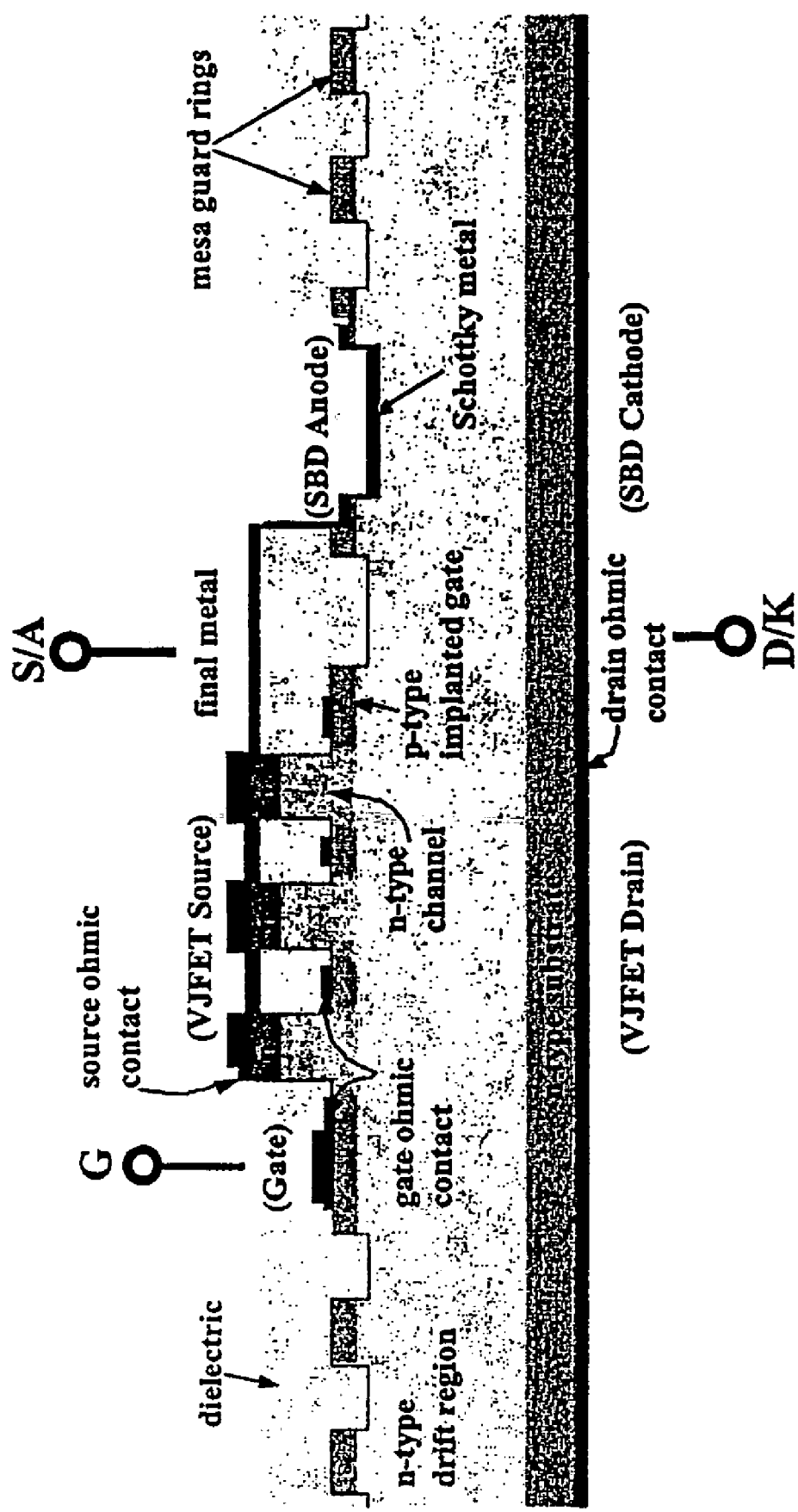
FIG. 2 is a cross-sectional view of a device comprising a vertical trench JFET and an integrated anti-parallel Schottky diode.

FIG. 2 is a cross-sectional representation of a device comprising a JFET and an SBD according to one embodiment of the invention. As shown in FIG. 2, the gate ohmic contact is not only underneath the large area contact pad, but is also shown extended between the source fingers. Having an ohmic contact extending the length of the gate fingers is desirable in some applications but is not required.

FIG. 2 also shows a mesa guard ring edge termination. This form of edge termination is similar in fabrication and function to that described in U.S. Pat. No. 6,693,308 (hereinafter referred to as "the '308 patent"), which patent is incorporated by reference herein in its entirety. In the device described in the '308 patent, however, the guard rings are etched into an epitaxially grown p-type layer whereas an implanted p-type layer is shown in FIG. 2. Other forms of edge termination including but not limited to JTEs, field plates, or mesa isolating the devices could also be used instead of etched guard rings.

As shown in FIG. 2, the device has a top epitaxial layer (i.e., cap layer) that is highly doped n-type ($n^+$). Adjacent to this layer is an n-type layer with lower doping than the $n^+$ cap described above that is used to form the channel region. Adjacent to the channel is an n-type drift layer or region. The drift region may have the same or lower doping concentration as the channel region. If the same doping level is used, the drift and channel regions can be formed from a single layer. Adjacent the drift region is another $n^+$ layer, which will form the basis for the drain contact. This layer can be an n-type substrate upon which the other layers are epitaxially grown.

Figure 3A:
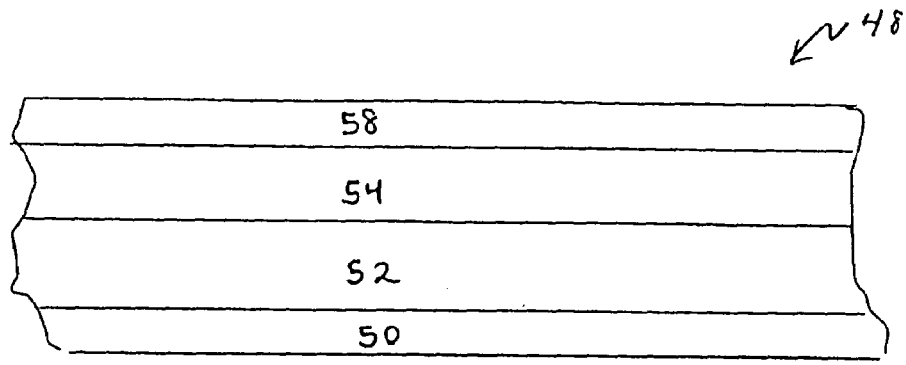
FIGS. 3A-3K illustrate a first method of making a device comprising a vertical trench JFET and an integrated anti-parallel Schottky diode.

The device comprising a JFET and an SBD according to a further embodiment can be made by a method as outlined below. This method is illustrated in FIGS. 3A-3K. As shown in FIG. 3A, a multi-layer structure 48 comprising semiconductor substrate 50, drift layer 52, channel layer 54 and source or cap layer 58 are provided. As set forth above, the multi-layer structure may alternatively comprise a single drift layer rather than separate drift and channel layers.

Figure 3B:
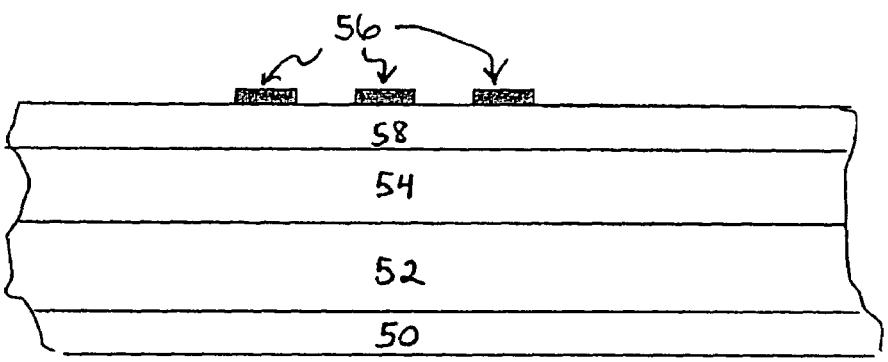

1. An ion implant/etch mask 56 is patterned on regions defining the source fingers (FIG. 3B).

Figure 3C:
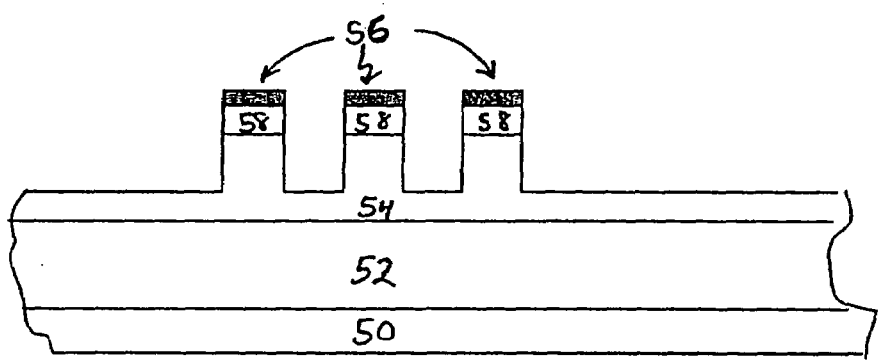

2. The SiC is dry etched to a depth extending past the $n^+$ cap layer and through some or the entire channel region (if a separate channel region is employed) or into the single layer forming the channel/drift region of the device (not shown). This is illustrated in FIG. 3C.

Figure 3D:
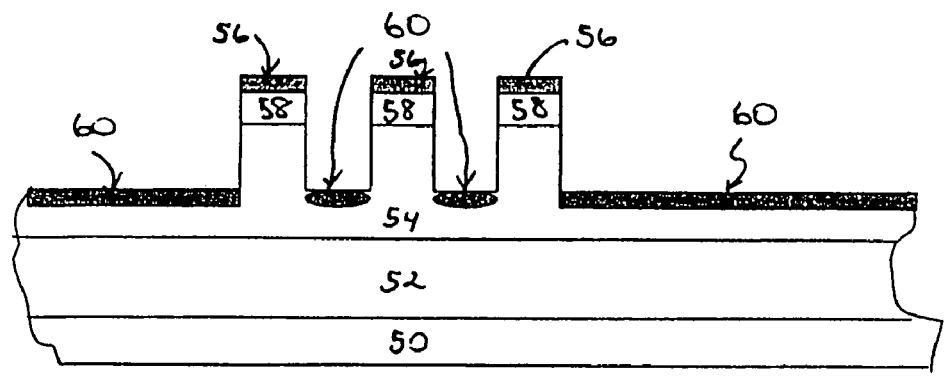

3. The sample is then implanted with p-type dopants to convert the top layer of exposed SiC 60 from n-type to p-type (FIG. 3D).

4. The implant/etch mask is stripped and then the wafer is annealed so as to make the implanted dopants electrically active (not shown).

Figure 3E:
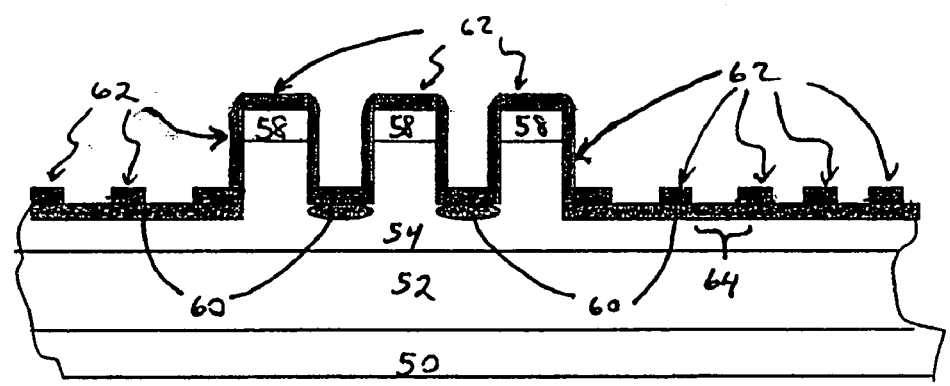

5. The wafer is then patterned with a dry etch mask 62 that defines the gate regions of the device and the guard rings, if employed (FIG. 3E). The field area and SBD anode area 64 are left exposed.

Figure 3F:
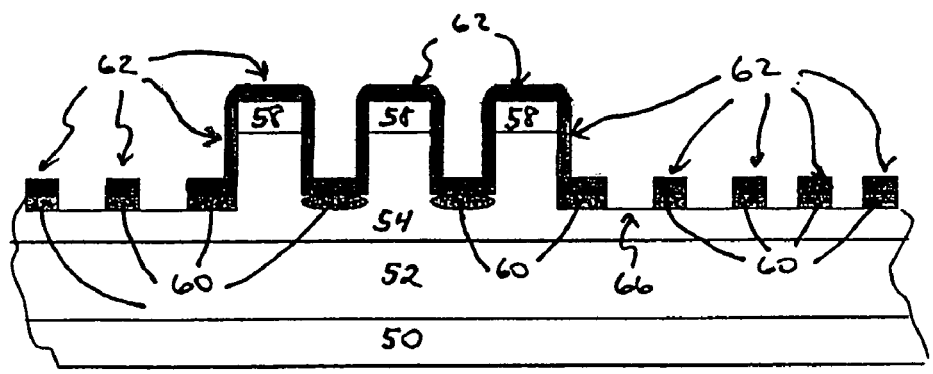

6. The exposed SiC is etched down past the bulk of the $p^+$ implanted region until adjacent devices are not electrically connected by said p-layer 66 (FIG. 3F).

Figure 3G:
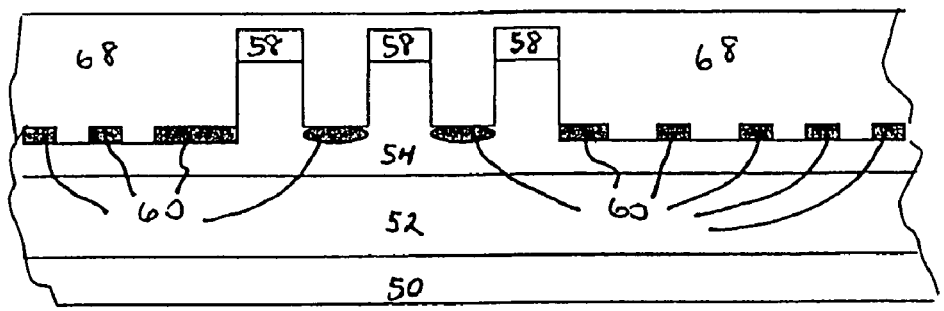

7. The etch mask 62 is stripped and dielectric 68 is deposited and/or processed in such a way that the dielectric thickness on top of the source fingers is considerably thinner than between the fingers and in the field (FIG. 3G).

Figure 3H:
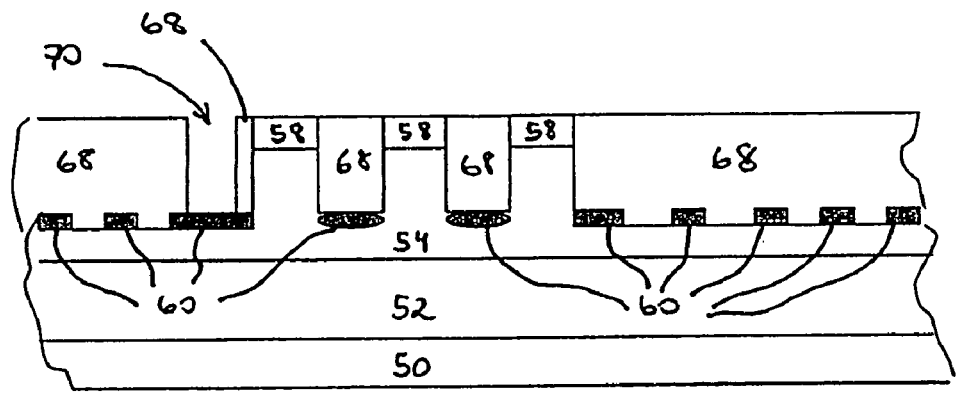

8. The dielectric is etched away until the tops of the source fingers are exposed while leaving a generous amount of oxide everywhere else (FIG. 3H).

9. Gate pad windows are patterned and etched down to the $p^+$ gate region 70 (FIG. 3H).

Figure 3I:
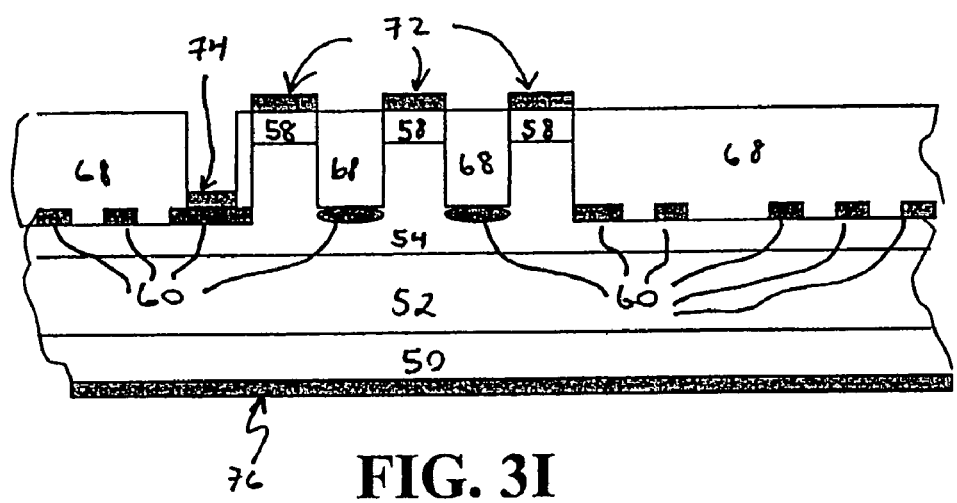

10. A suitable metal or metal stack is then deposited and annealed to form ohmic contacts on the source, gate, and drain (72, 74 and 76) of the device (FIG. 3I).

Figure 3J:
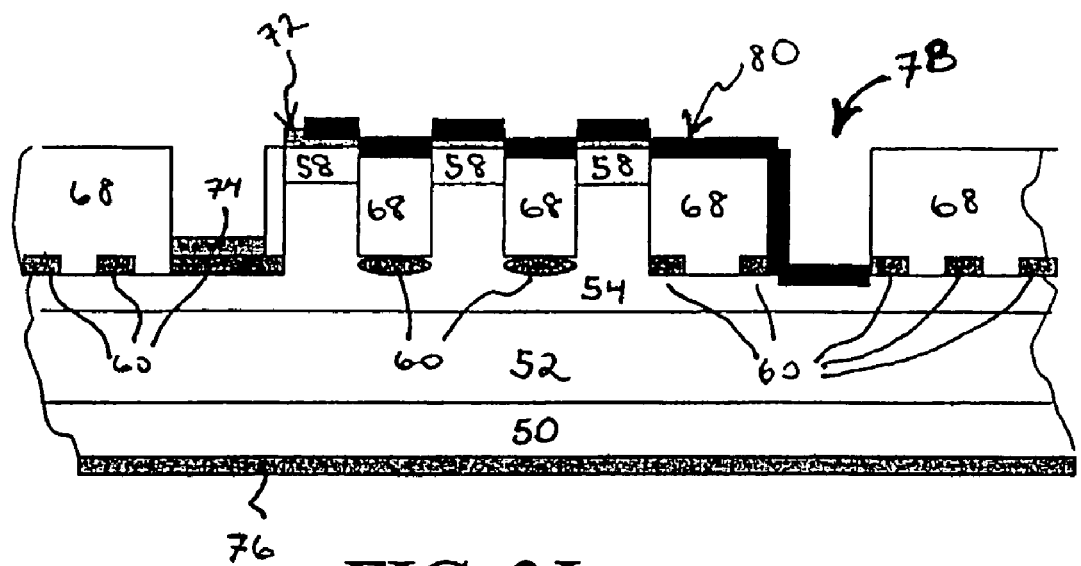

11. SBD anode windows 78 are patterned and the oxide is etched down to the n-type channel 54 (shown) or drift region 52 (not shown) (FIG. 3J). The exposed SiC is then etched further to remove any implant "tail" or residual implant damage from the Schottky anode region. Residual p-type dopants or implant damage can increase the turn on voltage of the SBD formed on the surface.

Figure 3K:
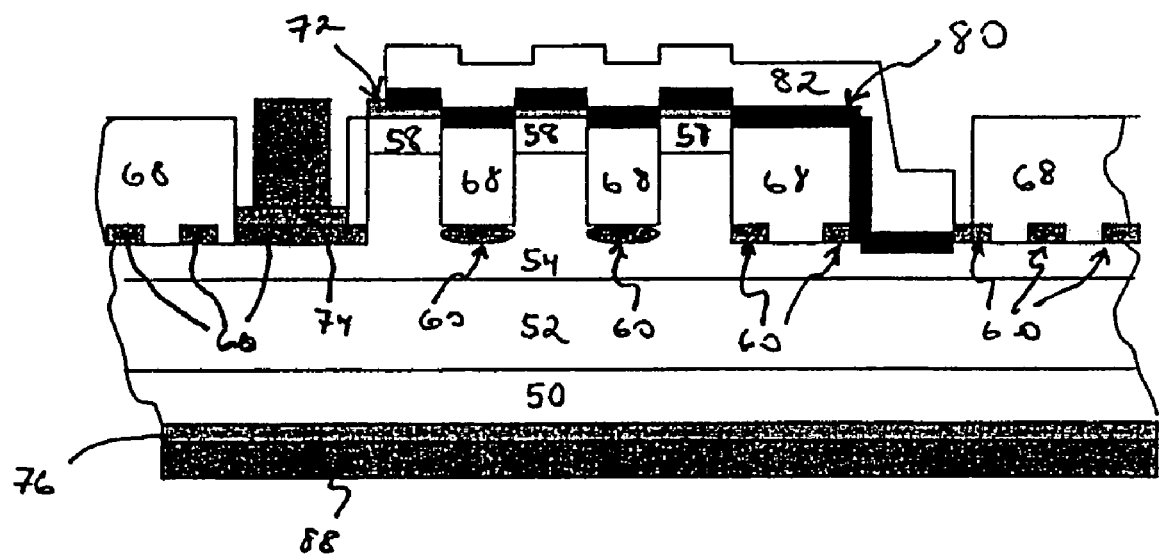

12. The Schottky barrier metal 80 is then formed on the SBD anode window and on the source contacts (72) (FIG. 3J). The final contact pad metal for the source/anode and the gate (82, 84) can then be deposited on the top of the wafer (FIG. 3K). The contact pad metal for the source, gate, and anode can be deposited simultaneously.

13. Backside final metal 88 is then deposited (FIG. 3K).

Figure 4A:
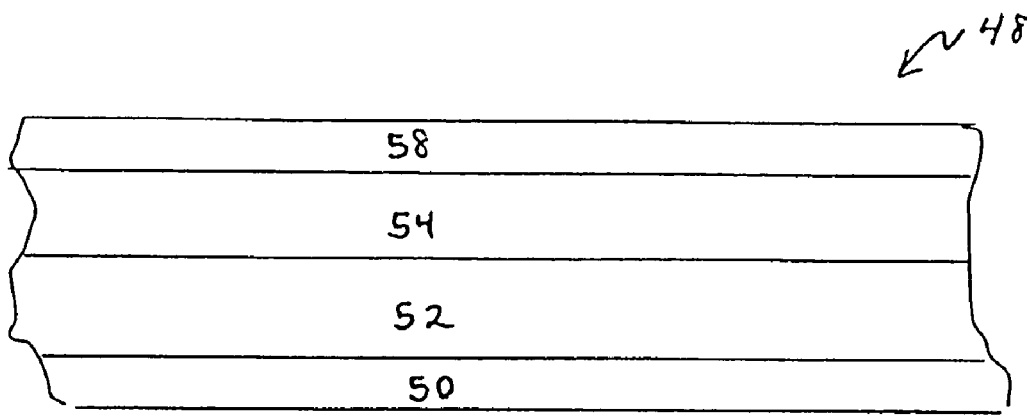
FIGS. 4A-4K illustrate a second method of making a device comprising a vertical trench JFET and an integrated anti-parallel Schottky diode wherein an implant mask is used to prevent ion implantation of the Schottky anode regions during the gate implantation step.
Figure 4B:
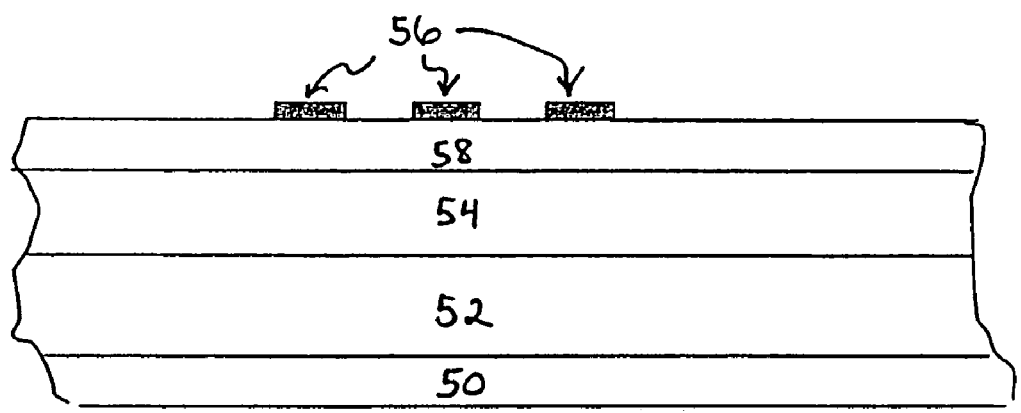
Figure 4C:
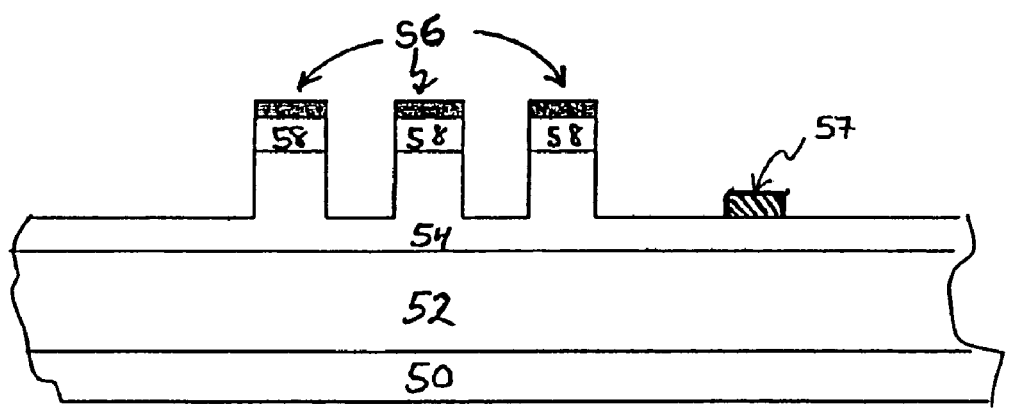
Figure 4D:
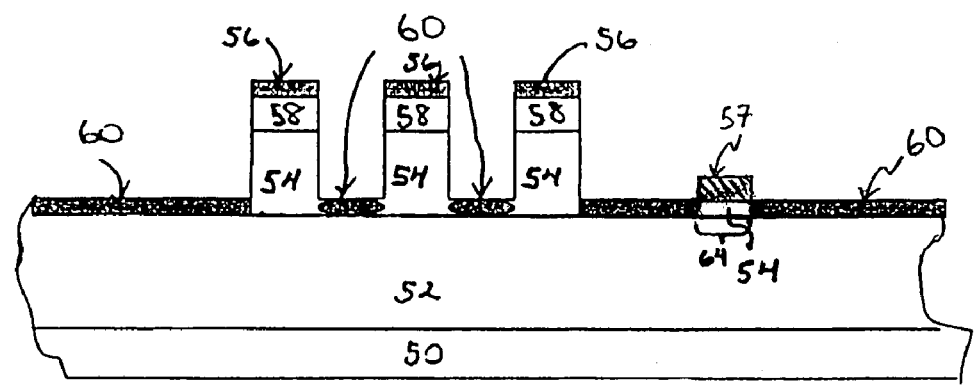
Figure 4E:
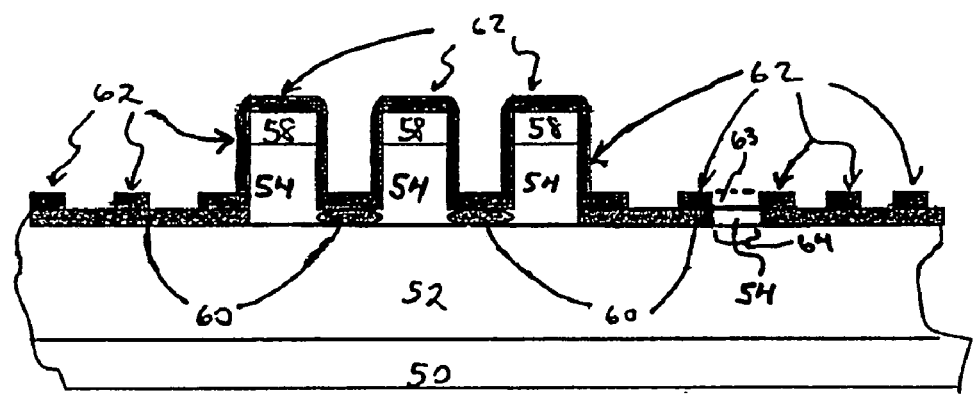
Figure 4F:
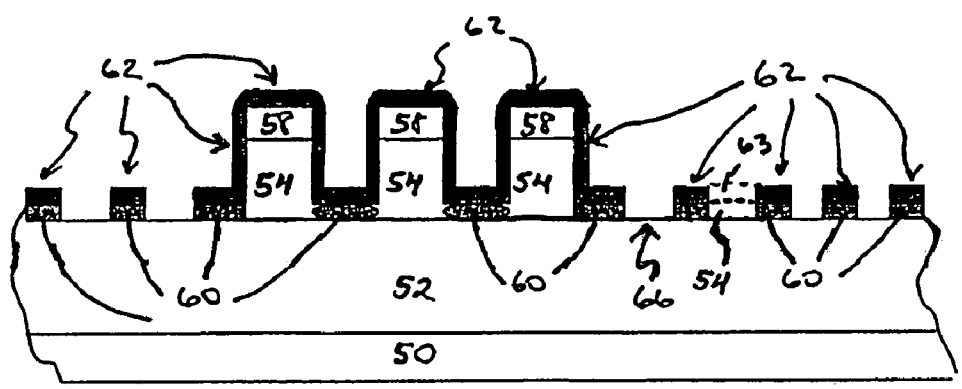
Figure 4G:
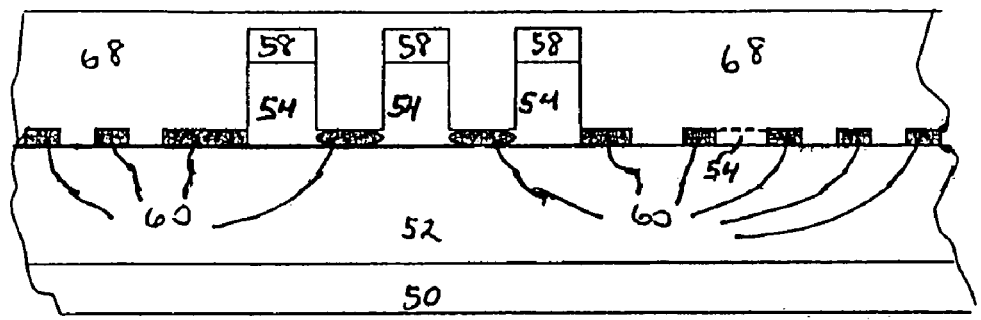
Figure 4H:
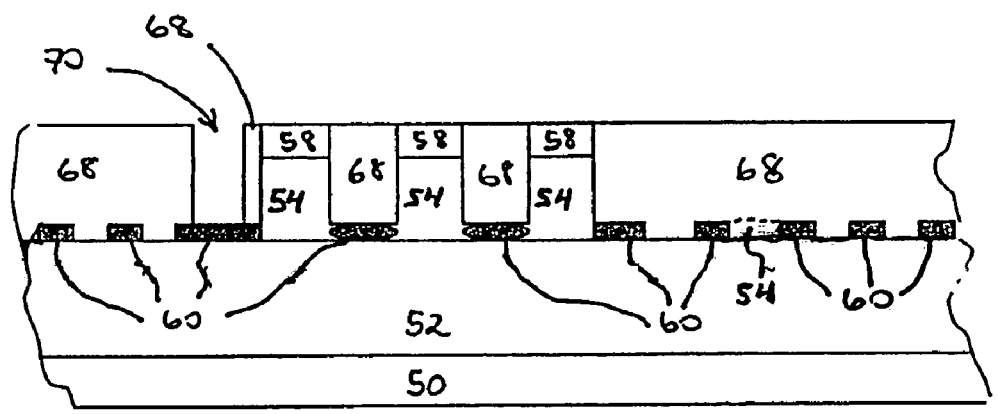
Figure 4I:
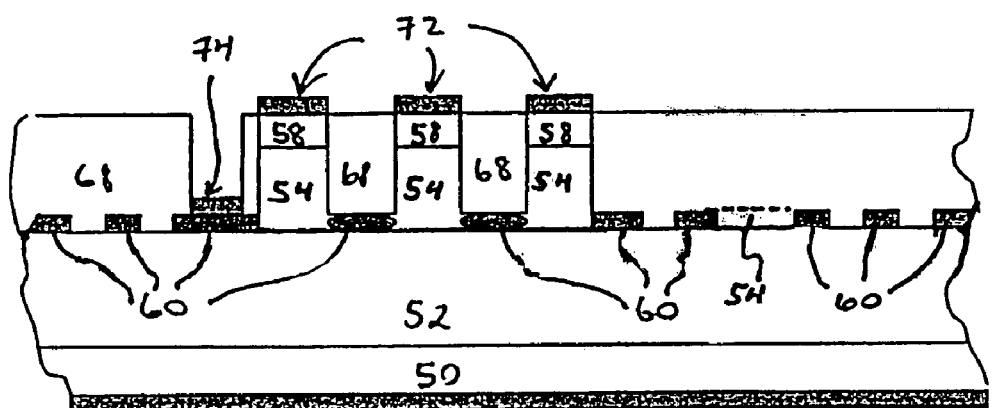
Figure 4J:
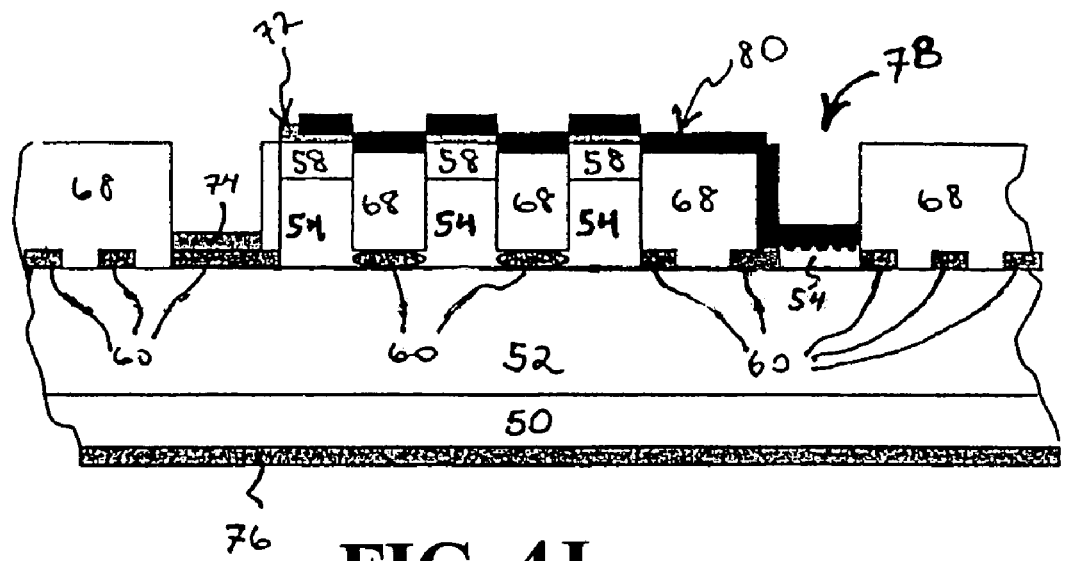

An alternative method of making a device comprising a JFET and an SBD is illustrated in FIGS. 4A-4K. As shown in FIG. 4A, a multi-layer structure 48 comprising semiconductor substrate 50, drift layer 52, channel layer 54 and source or cap layer 58 are provided. Although not shown, the multi-layer structure may alternatively comprise a drift layer comprising a single region rather than separate drift and channel regions. An ion implant/etch mask 56 is patterned on regions defining the source fingers (FIG. 4B). The SiC is dry etched to a depth extending past the $n^+$ cap layer and through some or the entire channel region (if a separate channel region is employed) or into the single layer forming the channel/drift region of the device (not shown) (FIG. 4C). As can be seen from FIG. 4C, a mask 57 is positioned on etched material on the channel layer (or on the drift layer, if no channel layer is present). Mask 57 will be used to define a Schottky anode region 64. The sample is then implanted with p-type dopants to convert the top layer of exposed SiC 60 from n-type to p-type (FIG. 4D). As can be seen from FIG. 4D, Schottky anode mask 57 prevents channel layer 54 from being implanted in the Schottky anode region 64. The implant/etch mask 56 and Schottky anode mask 57 are then stripped and the wafer is annealed so as to make the implanted dopants electrically active (not shown). The wafer is then patterned with a dry etch mask 62 that defines the gate regions of the device and the guard rings, if employed (FIG. 4E). The field area of the device is left exposed. In addition, the SBD anode region 64 can be either left exposed or masked 63. The exposed SiC is etched down past the bulk of the $p^+$ implanted region until adjacent devices are not electrically connected by said p-layer 66 (FIG. 4F). The unimplanted channel layer (54) of the SBD anode may be etched away during this etch step to expose the underlying drift region. Alternatively, exposed channel layer may remain in the Schottky anode region. The etch mask 62 (and optionally 63) is then stripped and dielectric 68 is deposited and/or processed in such a way that the dielectric thickness on top of the source fingers is considerably thinner than between the fingers and in the field (FIG. 4G). The dielectric is etched away until the tops of the source fingers are exposed while leaving a generous amount of oxide everywhere else (FIG. 4H). Gate pad windows are patterned and etched down to the p⁺ gate region 70 (FIG. 4H). A suitable metal or metal stack is then deposited and annealed to form ohmic contacts on the source, gate, and drain (72, 74 and 76) of the device (FIG. 4I). SBD anode windows 78 are patterned and the oxide is etched down to the n-type channel 54 (shown) or drift region 52 (not shown) in the SBD anode region (FIG. 4J). The Schottky barrier metal 80 is then formed in the SBD anode window and on the source contacts (72) (FIG. 4J).

Figure 4K:
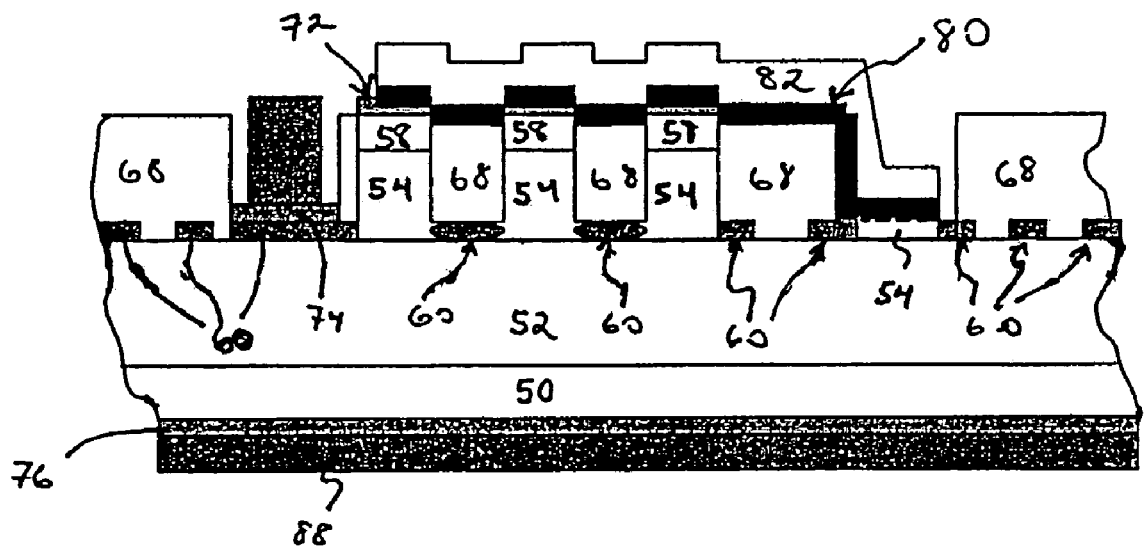

The Schottky metal can be deposited on the channel layer 54 as shown in FIG. 4K. Alternatively, the Schottky metal can be deposited on the underlying drift region (not shown). A Schottky diode formed on the channel layer will generally have a lower turn-on voltage but a higher reverse leakage than similar device comprising a Schottky diode formed on the drift region. The specific performance requirements of the device may dictate which method is employed. The Schottky metal may overlap a portion of the implanted material at the periphery of the Schottky anode as long as that implanted material is not electrically connected to the implanted gate of the JFET. The final contact pad metal for the source/anode and the gate (82, 84) can then be deposited on the top of the wafer (FIG. 4K). The contact pad metal for the source, gate, and anode can be deposited simultaneously.

FIGS. 3 and 4 illustrate basic processes that can be used to fabricate a device as shown in FIG. 2 comprising a vertical junction field effect transistor (JFET) and a Schottky barrier diode (SBD). Other details can be added and the order of some steps can be rearranged to obtain the device.

Various embodiments are described below.

According to a first embodiment, a SiC semiconductor device comprising a vertical junction field effect transistor (JFET) and a Schottky barrier diode (SBD) is provided. The device comprises a SiC semiconductor substrate layer of a first conductivity type, a SiC drift layer of the first conductivity type disposed on the substrate layer, a plurality of SiC source regions of the first conductivity type disposed on the drift layer, and a plurality of SiC gate regions of a second conductivity type different than the first conductivity type formed in the drift layer. The gate regions can be formed by ion implantation of a p-type dopant in the n-type drift layer. The device can further comprise ohmic contacts adjacent the substrate layer opposite the drift layer and adjacent the source and gate regions to form a JFET. The device also comprises a Schottky junction including a Schottky metal layer adjacent the drift layer. The Schottky metal layer can extend over the source ohmic contact(s) of the JFET such that the Schottky metal contacts the source ohmic contact(s) of the device. The device can further comprise final metal layers disposed on the Schottky metal layer and on the drain and gate ohmic contacts. According to this embodiment, the drain of the JFET also functions as the cathode of the SBD and the source of the JFET also functions as the anode of the SBD. The drift layer may comprise a drift region of the first conductivity type disposed on the substrate and a channel region also of the first conductivity type disposed on the drift region wherein the source or cap layer is disposed on the channel region. According to this embodiment, the channel region can have a higher doping level than the underlying drift region. An exemplary device according to this embodiment is shown in FIG. 2.

According to a further embodiment, a method of making a SiC semiconductor device comprising a JFET and an SBD is provided. The method according to this embodiment comprises:

positioning a first mask on a source layer of SiC of a first conductivity type, wherein the source layer is adjacent a SiC drift layer of the first conductivity type and wherein the drift layer is adjacent a SiC substrate layer of the first conductivity type;

selectively etching through the source layer and into the drift layer to form raised source regions separated by etched regions;

implanting dopants of the second conductivity type into exposed portions of the drift layer such that the implanted regions are SiC of the second conductivity type;

removing the first mask;

annealing the device to activate the dopants;

positioning a second mask on the source layer of the device;

forming gate regions, a Schottky anode region, and, optionally, edge termination structures by selectively etching through the implanted layer of the device to expose material of the first conductivity type;

removing the second mask;

depositing dielectric material on exposed etched surfaces of the device such that the dielectric material is thinner on the raised source regions;

etching the dielectric material to expose the source regions;

selectively etching through the dielectric material over the gate region to expose implanted material;

depositing metal on exposed source and gate regions to form source and gate ohmic contacts respectively;

depositing metal on the substrate opposite the drift layer to form a drain ohmic contact;

selectively etching through the dielectric over the SBD anode region to expose material of the first conductivity type;

depositing a Schottky metal layer in the SBD anode and in contact with the source ohmic contact;

depositing metal layers on the Schottky metal layer and the gate ohmic contact to form electrical contact pads;

forming a metal layer on the substrate opposite the drift layer to form the drain ohmic contact; and forming a metal layer on the drain ohmic contact to form a drain electrical contact pad;

wherein the device comprises a JFET comprising a source, a gate and a drain and an SBD comprising a cathose and an anode, wherein the drain of the JFET also functions as the cathode of the SBD and wherein the source of the JFET also functions as the anode of the SBD.

According to a further embodiment, the material of the first conductivity type is an n-type semiconductor material and the material of the second conductivity type is a p-type semiconductor material. According to a further embodiment, the source layer is more heavily doped than the underlying drift layer. In addition, the drift layer may comprise a drift region of the first conductivity type disposed on the substrate and a channel region also of the first conductivity type disposed on the drift region wherein the source layer is disposed on the channel region. The channel region can have a higher doping level than the underlying drift region.

The method as set forth above may further comprise additional etching in the anode region to remove implanted material remaining therein. In this manner, a device having a suitably low Schottky barrier height can be formed.

Suitable donor materials for doping SiC include nitrogen and phosphorous. Nitrogen is a preferred donor material. Suitable acceptor materials for doping silicon carbide include boron and aluminum. Aluminum is a preferred acceptor material. The above materials are merely exemplary, however, and any donor or acceptor material which can be doped into silicon carbide can be used.

The doping levels and thicknesses of the various layers of the device can be varied to produce a device having desired characteristics for a particular application. Unless otherwise indicated, heavily doped corresponds to dopant concentrations of $10^{18}$ atoms·cm$^{-3}$ or greater, lightly doped corresponds to dopant concentrations of $5 \times 10^{16}$ atoms·cm$^{-3}$ or less and moderately doped corresponds to dopant concentrations of between $5 \times 10^{16}$ atoms·cm$^{-3}$ and $10^{18}$ atoms·cm$^{-3}$.

The drift layer the device can be a SiC layer lightly doped with a donor material (i.e., n– doped) and the substrate layer can be a SiC layer heavily doped with a donor material (i.e., n+ doped). In addition, the source regions can be n+ doped SiC and the gate regions can be p or p+ doped SiC.

Doping of the SiC drift, channel and source layers can be performed in-situ during epitaxial growth of each of these layers on a SiC substrate. The SiC layers can be formed by any epitaxial growth method known in the art, including CVD, molecular beam and sublimation epitaxy. The doped SiC layers can be formed by doping in-situ during epitaxial growth wherein dopant atoms are incorporated into the silicon carbide during growth.

While the foregoing specification teaches the principles of the present invention, with examples provided for the purpose of illustration, it will be appreciated by one skilled in the art from reading this disclosure that various changes in form and detail can be made without departing from the true scope of the invention.

REFERENCES

[1] I. Sankin, J. N. Merrett, W. A. Draper, J. R. B. Casady and J. B. Casady, "A Review of SiC Power Switch: Achievements, Difficulties and Perspectives," International Conference on SiC and Related Materials 2003, Lyon, France, Oct. 6 10, 2003.
[2] C. S. Korman, B. J. Baliga, H-R. Chang, "Multicellular FET Having a Schottky Diode Merged Therewith," U.S. Pat. No. 5,111,253, May 5, 1992.
[3] B. J. Baliga et al., "Power Transistor Structure with High Speed Integral Antiparallel Schottky Diode," U.S. Pat. No. 4,967,243, Oct. 30, 1990.
[4] B. J. Baliga et al., "Power Bipolar Transistor Device with Integral AntiSaturation Diode," U.S. Pat. No. 4,969,027, Nov. 6, 1990.
[5] M. Kitabatake, "Semiconductor Element," U.S. Patent Application Publication No. US 2002/0047124 A1, Apr. 25, 2002.
[6] D. L. Plumton, "Vertical Field Effect Transistor and Diode," U.S. Pat. No. 6,097,046, Aug. 1, 2000.
[7] J. W. Palmour, "Junction Field-Effect Transistor Formed in Silicon Carbide," U.S. Pat. No. 5,264,713, Nov. 23, 1993.
[8] K. Asano, Y. Sugawara, S. Ryu, R. Singh, J. Paltnour, T. Hayashi and D. Takayama, "5.5 kV Normally-off Low RonS 4H-SiC SEJFET," Proceedings of the 2001 International Symposium on Power Semiconductor Devices and ICs, Osaka, Japan, pp. 23-26.
[9] J. H. Zhao, X. Li, K. Tone, P. Alexandrov, M. Pan and M. Weiner, "Design of a Novel Planar Normally-off power VJFET in 4H-SiC," Solid-State Electronics 47 (2003), pp. 377-384.
[10] J. H. Zhao, "Double-gated Vertical Junction Field Effect Power Transistor," U.S. Patent Application Publication No. 2003/0089930 A1, May 15, 2003.
[11] J. B. Casady, G. E. Carter, Y. Koshka, M. S. Mazzola, I. Sankin, "Self-Aligned Transistor and Diode Topologies in Silicon Carbide Through the Use of Selective Epitaxy or Selective Implantation," U.S. Patent Application Publication No. 2003/0034495, Feb. 20, 2003.
[12] I. Sankin, J. B. Dufrene, "Power SiC devices having raised guard rings," U.S. Pat. No. 6,693,308, Feb. 17, 2004.

What is claimed is:

1. A SiC semiconductor device comprising a vertical junction field effect transistor (JFET) comprising a source, a gate and a drain and a Schottky barrier diode (SBD) comprising an anode and a cathode, the device comprising:
   a SiC semiconductor substrate layer of a first conductivity type;
   a SiC drift layer of the first conductivity type on the substrate layer;
   a plurality of SiC source regions of the first conductivity type on the drift layer;
   a plurality of SiC gate regions of a second conductivity type different than the first conductivity type formed in the drift layer;
   a Schottky junction including a Schottky metal layer adjacent the drift layer; and
   a drain ohmic contact adjacent the substrate layer opposite the drift layer, a source ohmic contact adjacent the source region and a gate ohmic contact adjacent the gate region;
   wherein the Schottky metal layer is in electrical contact with the source ohmic contact, wherein the drain ohmic contact is a contact for the drain of the JFET and the cathode of the SBD and wherein the source ohmic contact is a contact for the source of the JFET and is electrically connected to the anode of the SBD.

2. The device of claim 1, wherein the material of the first conductivity type is an n-type semiconductor material and the material of the second conductivity type is a p-type semiconductor material.

3. The device of claim 1, wherein the gate regions are formed by ion implantation of a dopant of the second conductivity type in the drift layer.

4. The device of claim 1, further comprising final metal layers disposed on the Schottky metal layer and on the drain and gate ohmic contacts.

5. The device of claim 1, wherein the drift layer comprises a drift region of the first conductivity type disposed on the substrate and a channel region also of the first conductivity type disposed on the drift region wherein the source regions are disposed on the channel region.

6. The device of claim 4, wherein the channel region has a higher doping level than the underlying drift region.

7. The device of claim 1, wherein the drift layer has a dopant concentration of $5 \times 10^{16}$ atoms·cm$^{-3}$ or less.

8. The device of claim 1, wherein the substrate layer has a dopant concentration of $10^{18}$ atoms·cm$^{-3}$ or greater.

9. The device of claim 1, wherein the source regions have a dopant concentration of $10^{18}$ atoms·cm$^{-3}$ or greater.

10. The device of claim 1, wherein the gate regions have a dopant concentration of $10^{18}$ atoms·cm$^{-3}$ or greater.

11. The device of claim 1, wherein the gate regions have a dopant concentration of between $5\times10^{16}$ atoms·cm$^{-3}$ and $10^{18}$ atoms·cm$^{-3}$.

12. The device of claim 1, wherein:
the drift layer has a dopant concentration of $5\times10^{16}$ atoms·cm$^{-3}$ or less;
the substrate layer has a dopant concentration of $10^{18}$ atoms·cm$^{-3}$ or greater;
the source regions have a dopant concentration of $10^{18}$ atoms·cm$^{-3}$ or greater; and
the gate regions have a dopant concentration of at least $5\times10^{6}$ atoms·cm$^{-3}$.

13. The device of claim 1, wherein the Schottky metal layer extends over the source ohmic contact such that the Schottky metal is in electrical contact with the source ohmic contact.

14. The device of claim 1, further comprising a metal layer in contact with the Schottky metal layer and which extends over the source ohmic contact and which forms an electrical connection between the Schottky metal layer and the source ohmic contact.

* * * * *